United States Patent [19]

Rinderle

[11] Patent Number: 4,684,833
[45] Date of Patent: Aug. 4, 1987

[54] MIXER STAGE

[75] Inventor: Heinz Rinderle, Heilbronn, Fed. Rep. of Germany

[73] Assignee: Telefunken Electronic GmbH, Heilbronn, Fed. Rep. of Germany

[21] Appl. No.: 677,354

[22] Filed: Dec. 3, 1984

[30] Foreign Application Priority Data

Dec. 16, 1983 [DE] Fed. Rep. of Germany ....... 3345497

[51] Int. Cl.⁴ .................. H03D 13/00; H03K 9/06
[52] U.S. Cl. .................. 307/525; 307/271; 307/219.1; 328/156; 328/15; 328/160
[58] Field of Search .............. 307/529, 525, 271, 498, 307/219.1; 328/15, 160, 133, 156

[56] References Cited

U.S. PATENT DOCUMENTS

| 3,158,752 | 11/1964 | Strief | 307/529 |
|---|---|---|---|
| 3,177,378 | 4/1965 | Pulfer et al. | 307/529 |
| 4,317,230 | 2/1982 | Boubouleix | 455/319 |
| 4,519,096 | 5/1985 | Cerny, Jr. | 455/137 |

FOREIGN PATENT DOCUMENTS

| 1012338 | 3/1955 | Fed. Rep. of Germany . |
|---|---|---|
| 1269683 | 6/1964 | Fed. Rep. of Germany . |
| 1172324 | 4/1970 | Fed. Rep. of Germany . |
| 2105431 | 2/1971 | Fed. Rep. of Germany . |
| 2733382 | 2/1979 | Fed. Rep. of Germany . |
| 2624133 | 9/1979 | Fed. Rep. of Germany . |
| 965671 | 8/1964 | United Kingdom . |
| 1003288 | 9/1965 | United Kingdom . |
| 1170099 | 11/1969 | United Kingdom . |

OTHER PUBLICATIONS

"Diodenabstimnlung in Rundfunk–und Fernsehempfangern", Electronik–Anzeiger, No. 12, vol. 26, 1969.
Funk-Technik (Radio Engineering), 1964, No. 16, pp. 574–576, "Aufuartgeregelte Mischstufe mit Transistoren".

Primary Examiner—Stanley D. Miller
Assistant Examiner—Richard Roseen
Attorney, Agent, or Firm—Spencer & Frank

[57] ABSTRACT

In a mixer stage comprising a transistor for mixing, with the input signal and/or the oscillator signal being fed inductively to the mixing transistor, there is provided for inductively coupling the mixer transistor to the corresponding filter a coil which is magnetically coupled to this filter. The inductivity of the coupling coil is of such dimensions that the source impedance controlling the transistor to a greater than the input impedance of the mixer transistor when the filter is aligned.

9 Claims, 13 Drawing Figures

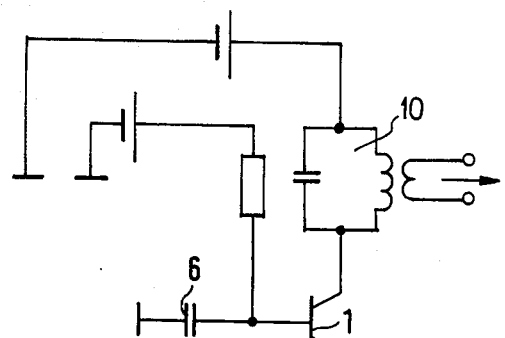
FIG. 3
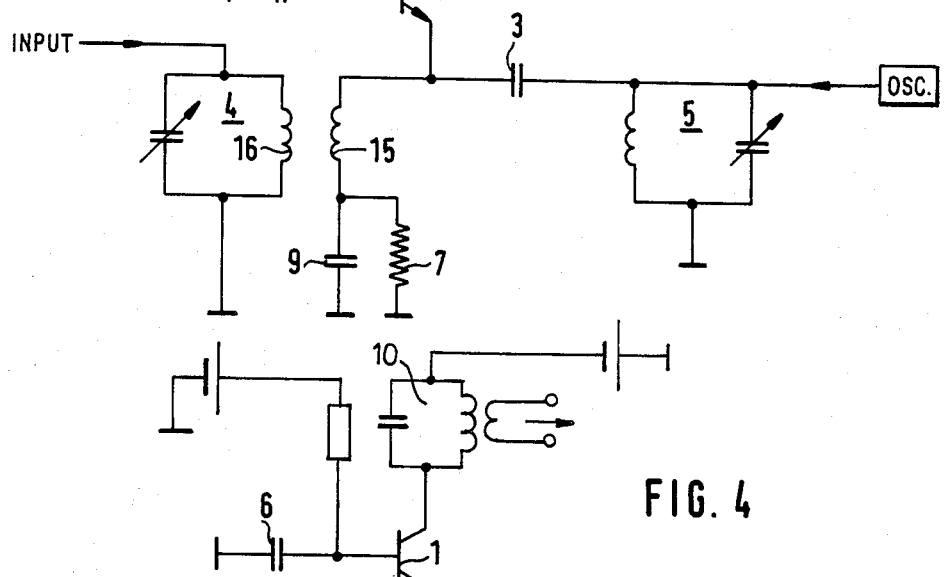
FIG. 4
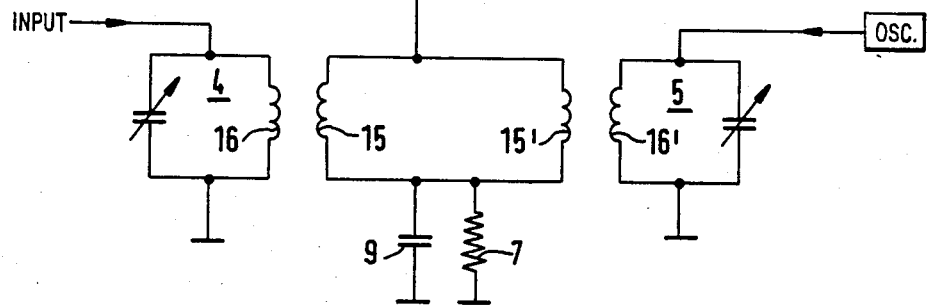

MIXER STAGE

BACKGROUND OF THE INVENTION

The invention relates to a mixer stage with a transistor for mixing, which is fed an input signal and an oscillator signal for mixing, wherein the input signal is fed to the mixer transistor via a frequency-selective input filter, and wherein the input impedance of the mixer transistor is smaller than the source impedance driving it at the operating frequency.

Such mixer stages are known. The input impedance of the mixer transistor in such a mixer stage is smaller than the source impedance driving it when the mixer transistor is operated using a bipolar transistor as mixer transistor in common base circuit and using a field-effect transistor as mixer transistor in common gate circuit. In mixer stages wherein the mixer transistor is operated in common base circuit or in common gate circuit, respectively, with the input impedance of the mixer transistor consequently being smaller than the source impedance driving it, the coupling coil which is used for coupling the mixer transistor to the corresponding filters is not magnetically coupled to the corresponding filter coil and is therefore also not arranged together with the filter coil on a common coil carrier. For, the opinion prevails that when the mixer transistor is operated in common base circuit or in common gate circuit, respectively, it is not possible to use the magnetic coupling between filter and transistor input customary in other basic circuits such as common emitter or source circuits because the low-ohmic input impedance of the mixer transistor excessively damping the input filter in a common base circuit or common gate circuit, respectively, thus decreasing the selectivity of the filter accordingly. On the other hand, however, a magnetic coupling filter between the filter coil and the transistor input using a coupling coil is desirable because this solution is more space-saving and also more cost efficient than a non-magnetic coupling of the mixer transistor to the filter.

SUMMARY OF THE INVENTION

The object underlying the invention is to provide a mixer stage which enables magnetic coupling of the mixer transistor to the filter coil without causing strong damping of the input filter, also when the mixer transistor is operated in common base or common gate circuit, respectively.

According to the invention in a selective amplifier stage the input signal and/or the oscillator signal is fed inductively to the mixer transistor, in that there is provided for coupling the mixer transistor to the respective filter, a coil which is magnetically coupled to this filter, and in that the inductivity of the coupling coil is of such dimensions that the source impedance driving the transistor is greater than the input impedance of the mixer transistor after alignment or tuning of the filter.

The noise factor and the power amplification of the mixer stage are set by the magnetic coupling between the two coils. By means of the coupling between the two coils it is possible to arrive at a compromise between optimal noise factor and optimal power amplification. A compromise is preferred because with optimal noise factor setting, the power amplification of the stage is generally insufficient. It is furthermore recommendable to provide the inductivity of the coupling coil with such dimensions that there is noise tuning at the input of the mixer transistors. What is meant by this is that the phase of the source impedance is tuned so as to ensure that the noise factor becomes minimal at a predetermined source impedance.

Such a setting is required, for example, when capacitances adversely affecting the phase of the source impedance for the signal frequency become effective parallel to the transistor input. This is the case, for example, if the filter are coupled capacitively to the input of the mixer transistor.

BRIEF DESCRIPTION OF THE DRAWINGS

The invention will now be described in greater detail, by way of examples, with reference to the drawings, in which:

FIG. 3 shows the coupling of the oscillator signal;

FIG. 4 shows the inductively coupling of the oscillator circuit to the mixer transistor;

FIG. 1 shows a known mixer stage circuit which may, for example, be used in VHF radio receivers. In this mixer stage circuit a bipolar amplifier transistor 1 in common base circuit is coupled capacitively to the tuning circuit or input filter 4, and to the variable oscillator circuit 5 via the capacitors 2 and 3 respectively. The received signal is fed to the input filter 4. Between the base of transistor 1 and the reference potential there is located a capacitor 6 constituting a short circuit for the operating frequency.

The base of transistor 1 is fed the required base potential. The capacitor 2 is of such capacitance in the known arrangement that there is almost noise-optimal matching of the mixer transistor 1 to the filter 4. This type of coupling ensures that maximum amplification and minimum noise (noise factor) concur when the input filter 4 is aligned or tuned. The capacitor 3 is of such capacitance that the source impedance driving the mixer transistor is greater at the oscillator frequency than the input impedance of the mixer transistor. Choosing such a capacitance ensures that the oscillator circuit puts practically no load on the transistor input at the signal frequency. A base potential at the mixer transistor in combination with the resistance 7 serves the purpose of setting the operating point for the mixer transistor. The coil (RF-choke) 8 and the capacitor 9 are generally of such dimensions that their series resonance corresponds approximately to the intermediate or resultant frequency from mixing the input frequency and the oscillator frequency. The formed resultant frequency signal is coupled out via the resultant frequency filter 10. FIG. 2 explains the relationship between filter coupling and source impedance for the mixer transistor. FIGS. 2a and 2c define the source impedance $Z_Q$ for the capacitive and the inductive filter coupling according to the invention, and FIGS. 2b and 2d, respectively, define the curve of the source impedance $Z_Q$ in dependence upon the operating frequency for the type of coupling concerned. The source impedance $Z_Q$ acting upon the transistor 1 between its emitter and the reference potential is, according to FIGS. 2a and 2c, respectively, that impedance which is effective between points 11 and 12. The $Z_Q$ curve according to FIGS. 2b and 2d, respectively, displays a maximum 13 and a minimum 14. While with the known mixer stage circuit with magnetic coupling (common emitter circuit) is is commonly the case that the circuit is operated in such a way that the maximum 13 of the source impedance $Z_Q$ occurs at the operating frequency, the circuit according to the invention, which also features magnetic coupling, but in combination with a common base circuit, is operated in such a way that the minimum 14 of the source impedance $Z_Q$ occurs at the operating frequency. Such a setting is obtained by providing the inductivity of the coupling coil 15 with appropriate dimensions and also by appropriate setting of the coupling degree between the coupling coil 15 and the filter coil 16. The minimum of the source impedance $Z_Q$ may, for example, be chosen in such a way that there is noise matching between the input filter 4 and the transistor 1. There is noise matching when the noise factor of the mixer stage in dependence upon the source impedance $Z_Q$ reaches a minimum. In practical application, however, as mentioned before, it is generally expedient not to set noise matching, but rather to select the minimum source impedance such that there is a compromise between noise matching and power matching. For example, such a compromise exists when the mixer transistor encounters and impedance of 100 to 500 ohms.

A further reduction in the noise factor is attainable by means of a certain phase setting of the source impedance $Z_Q$, i.e., for example, by the choice of the inductivity of the coupling coil 15. Such a phase setting is called noise tuning.

The invention shall now be explained in greater detail with reference to an embodiment.

Figure 1:
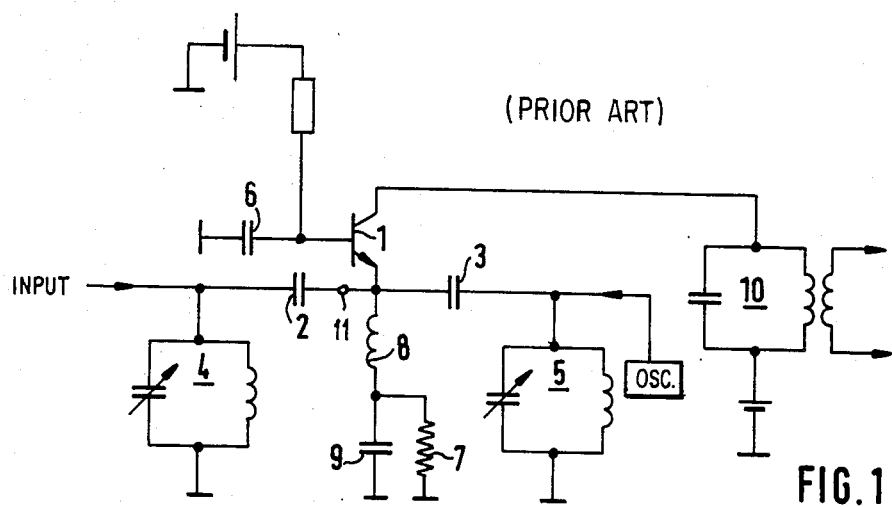
FIG. 1 shows a known mixer stage.
Figure 2A:
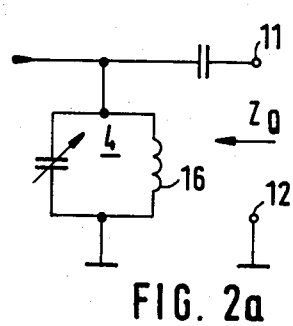
FIGS. 2a–2d shows the relationship between filter coupling and source impedance for the mixer transistor.
Figure 2B:
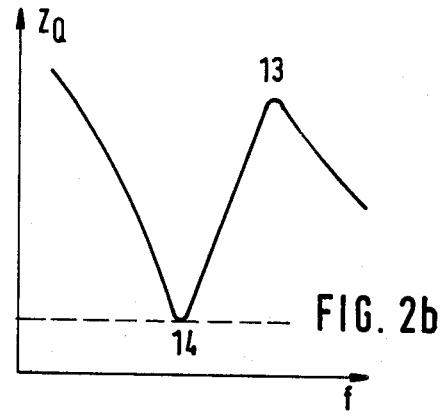
Figure 2C:
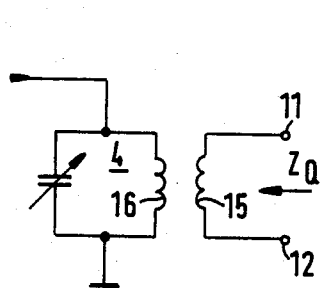
Figure 2D:
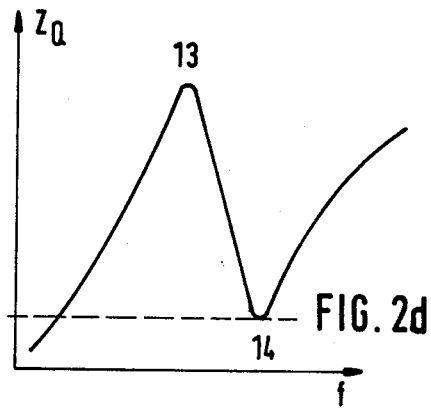

In the known mixer stage according to FIG. 1, the mixer transistor 1 is capacitively coupled to the input filter 4 by means of the capacitor 2. In contrast to this, the mixer transistor 1 is inductively coupled to the input filter 4 in the mixer stage according to the invention as shown in FIG. 3 by means of the coupling coil 15 which is magnetically coupled to the filter coil 16. This magnetic coupling according to the invention, however, requires that the inductivity of the coupling coil 15 and the coupling degree between coil 15 and the filter coil 16 be of such dimensions that the source impedance driving the mixer transistor 1 at the operating frequency (signal frequency) is greater when the filter 4 is tuned than the input impedance of the mixer transistor 1. With this dimensioning, a minimum of the source impedance occurs at the operating frequency as is described in connection with FIG. 2. The magnetic coupling provided according to the invention between the coupling coil 15 and the filter coil 16 also offers the possibility of achieving noise tuning between input filter 4 and mixer transistor 1. This may be attained by dimensioning the inductivity of the coupling coil accordingly.

The capacitance of the capacitor 9 may be dimensioned such that this capacitance in combination with the inductivity of the coupling coil 15 produces series resonance for the resultant frequency. The rejection of the oscillator signal is carried out in the mixer stage according to FIG. 3 via the oscillator circuit 5 and the coupling capacitor 3. Acting upon the mixer transistor 1 is a source impedance which has two components. The one component results from the coupling of the input filter 4, and the other component from the coupling of the oscillator circuit. The type of coupling chosen in FIG. 3 causes the source impedance to become minimal for the input frequency (signal frequency), which results from the input filter and its coupling. Aside from this minimum of the source impedance there is also a second minimum of the source impedance which occurs at the oscillator frequency and results from the oscillator circuit and its coupling.

The mixer stage according to FIG. 4 differs from the mixer stage according to FIG. 3 in that in accordance with the invention not only the input filter 4 but also the oscillator circuit 5 (by means of the coil 15'), are inductively coupled to the mixer transistor 1. In this embodiment of the invention, the coil 15' is magnetically coupled to the oscillator circuit coil 16'. In this case, the inductivity of the coupling coil 15' and its coupling degree with the oscillator circuit coil 16' are dimensioned such as to ensure that the minimum source impedance occurs at the input of the mixer transistor 1 at the oscillator frequency.

Figure 5:
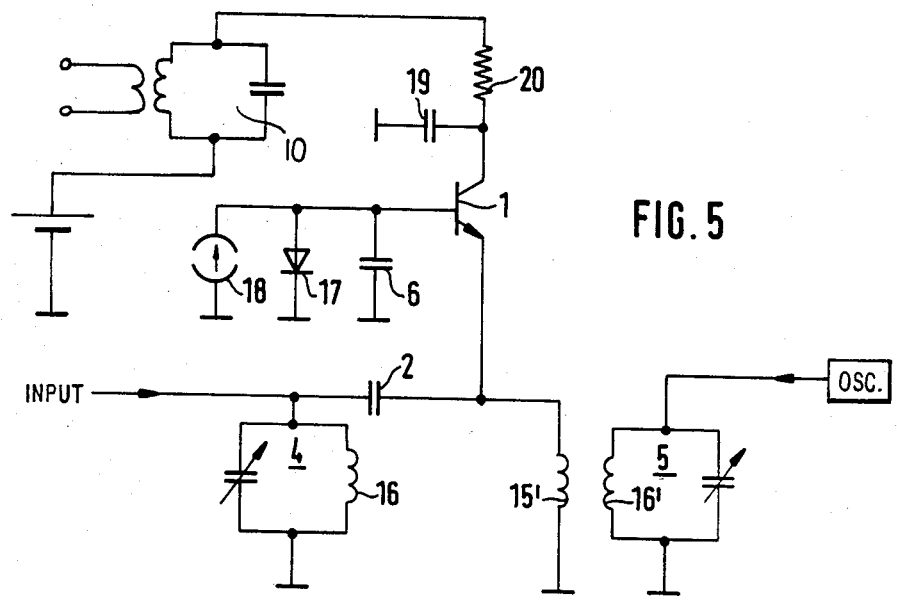
FIG. 5 shows the capacitively coupling of the input filter to the mixer transistor.

With the mixer stage according to FIG. 5, the input filter 4 is coupled capacitively to the mixer transistor 1 by means of the capacitor 2, whereas the oscillator circuit 5 is coupled inductively to the mixer transistor 1 by means of the coupling coil 15'. The inductivity of the coupling coil 15' and the coupling degree between the coupling coil 15' and the filter coil 16' are dimensioned in accordance with the invention in the same manner as described above in connection with FIG. 4.

With the mixer stage according to FIG. 5, the operating point setting for the mixer transistor 1 is not effected by means of an emitter resitance 7 in combination with the base potential, as with the mixer stages according to FIGS. 3 and 4, but rather by means of a direct current which is fed to the diode 17 from the current source 18. The RC combination consisting of the resistor 20 and the capacitor 19 serves the purpose of suppressing at the output the component of the output current of the mixer transistor 1 resulting from the oscillator signal.

Figure 6:
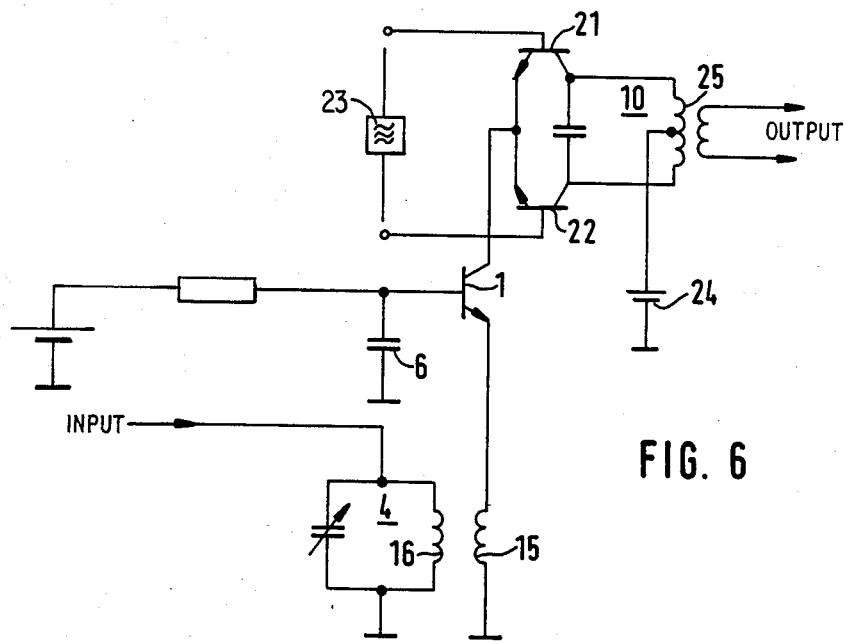
FIG. 6 shows the mixing at the output of the mixer transistor.

The mixer stage according to FIG. 6 differs from the mixer stage according to FIG. 5 in that the mixing does not occur in the transistor 1, but at its output by means of the transistors 21 and 22. Here, the oscillator signal (source 23) is fed between the bases of the transistors 21 and 22. In this circuit, the output signal is taken from the IF filter 10. The operating voltage (source 24) for the mixer stage is fed to the intermediate frequency filter (coil 25).

Figure 7:
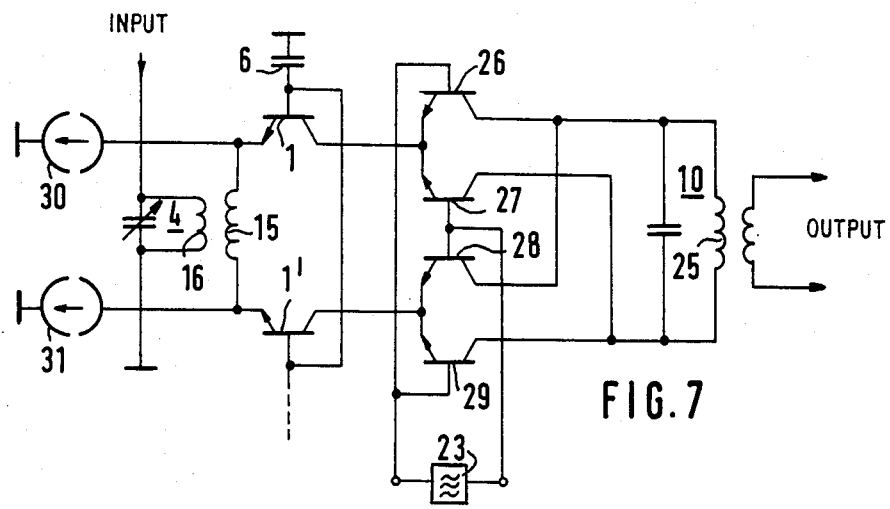
FIG. 7 shows a mixer stage with a symmetric design.
Figure 8:
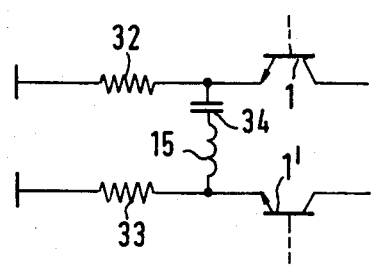
FIG. 8 shows resistors instead of the current sources of FIG. 7.

FIG. 7 shows a mixer stage with a symmetric design in which the input signal is fed to the emitters of transistors 1 and 1' via the coupling coil 15. Mixing occurs at the outputs of transistors 1 and 1' by means of transistors 26, 27, 28 and 29. The oscillator signal required for this purpose (source 23) is fed to the bases of transistors 26 to 29. The output signal is picked up from the IF filter 10. The supplying of transistors 1 and 1' is carried out by the current sources 30 and 31. Instead of the current sources 30 and 31 it is also possible according to FIG. 8 to provide resistors 32, 33. The capacitor 34 in FIG. 8 has the task of rendering high-resistive the connection of the two emitters of transistors 1 and 1' for the intermediate frequency. The driving of a mixer stage according to FIG. 7 may also be carried out in such a way that only one of the transistors 1, 1' is driven by the input signal.

Figure 9:
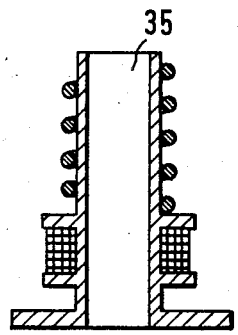
FIG. 9 shows a practical embodiment of the magnetic coupling between the coils.
Figure 10:
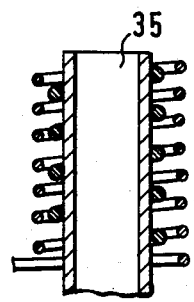
FIG. 10 shows another coupling between the coils.

FIGS. 9 and 10 show a practical embodiment of the magnetic coupling between the coils. According thereto, conductors of the coils are located on a common coil carrier 35. While the coils in the arrangement shown in FIG. 9 are superimposed, the two coils in the arrangement according to FIG. 10 are arranged concentrically to one another and are consequently nested within each other.

What claimed is:

1. A mixer stage for mixing an input signal having a selected signal frequency with an oscillator signal to produce an output signal having a resultant frequency, comprising:

a mixer transistor connected in common base configuration, having an input and an output, and having a selected input impedance;

a source of reference potential and a source of the oscillator signal; and circuit means connected between said source of reference potential and said mixer transistor input, and connecting said source of the oscillator signal and a source of the input signal to said mixer transistor input, said circuit means having a source impedance located between said source of reference potential and said transistor input; wherein said circuit means comprise:

a first frequency-selective input filter set to the selected signal frequency for supplying the input signal to said transistor input;

a second input filter set to the frequency of the oscillator signal for supplying the oscillator signal to said transistor input;

a coupling coil connected to said transistor input and inductively coupled to one of said filters for applying the signal supplied by said one of said filters to said transistor input, said coupling coil constituting a component of the source impedance and having an inductance selected for causing the source impedance to be greater than the transistor input impedance;

a capacitor connected in series with said coupling coil and forming with said coupling coil a series resonant circuit having a resonant frequency equal to the resultant frequency; and an RC filter connected to the output of said mixer transistor for suppressing the oscillator signal component of the output signal.

2. A mixer stage according to claim 1 wherein said frequency-selective input filter is tunable.

3. A mixer stage according to claim 1 wherein the mixer stage has a noise factor and a power amplification which are set by the degree of mutual magnetic coupling between said coupling coil and said one of said filters.

4. A mixer stage according to claim 1 wherein a compromise is arrived at between optimal noise factor and optimal power amplification by means of the inductive coupling between said coupling coil and said one of said filters when the source impedance is between 100 to 500 Ohms.

5. A mixer stage according to claim 1 wherein the inductance of the coupling coil is varied such that there is noise tuning between one of said filters and the mixer transistor.

6. A mixer stage according to claim 1 wherein said coupling coil has two conductors which are arranged on a common carrier.

7. A mixer stage according to claim 1 wherein said coupling coil has inductance selectable by the alignment of its conductors.

8. A mixer stage according to claim 1 further comprising means connected for applying a potential to the base of said mixer transistor for setting the operating point of said mixer transistor.

9. A mixer stage according to claim 8 wherein said means for applying a potential comprise a direct current source and a diode connected together to said mixer transistor base.

* * * * *